United States Patent [19]

Nigorikawa et al.

[11] 4,389,723
[45] Jun. 21, 1983

[54] HIGH-SPEED PATTERN GENERATOR

[75] Inventors: Atsushi Nigorikawa; Hiroshi Yokoyama; Takanori Fujieda, all of Tokyo, Japan

[73] Assignees: Nippon Electric Co., Ltd.; Ando Electric Co., Ltd., both of Tokyo, Japan

[21] Appl. No.: 224,986

[22] Filed: Jan. 14, 1981

[30] Foreign Application Priority Data

Jan. 18, 1980 [JP] Japan ................................ 55-3487

[51] Int. Cl.³ .......................................... G01R 31/26
[52] U.S. Cl. ........................................ 371/27; 364/900
[58] Field of Search ................... 371/27; 364/770, 785, 364/786, 747, 200, 900; 235/92 CP, 92 SA

[56]  References Cited

U.S. PATENT DOCUMENTS

| 3,564,505 | 2/1971 | Finnila et al. ...................... 364/200 |
| 3,930,235 | 12/1975 | Kobus et al. ...................... 364/200 |
| 4,293,950 | 10/1981 | Shimizu et al. ...................... 371/27 |
| 5,052,604 | 10/1977 | Maitland et al. ...................... 364/770 |

*Primary Examiner*—Charles E. Atkinson
*Attorney, Agent, or Firm*—Flynn, Thiel, Boutell, & Tanis

[57] ABSTRACT

A high-speed pattern generator includes a plurality of arithmetic and logic units (ALUs) which are n in number and have m-bit outputs, n registers receptive as inputs as outputs from the ALUs, and n-bit shift registers which are m in number, each ALU and connected register being unitized and coupled to the shift registers. The outputs of the registered input data are applied to the ALUs. The unitized ALUs and registers produce outputs applied in the same sequence to bits of the shift registers, which are responsive to clock pulses to generate a pattern output at a high speed.

5 Claims, 7 Drawing Figures

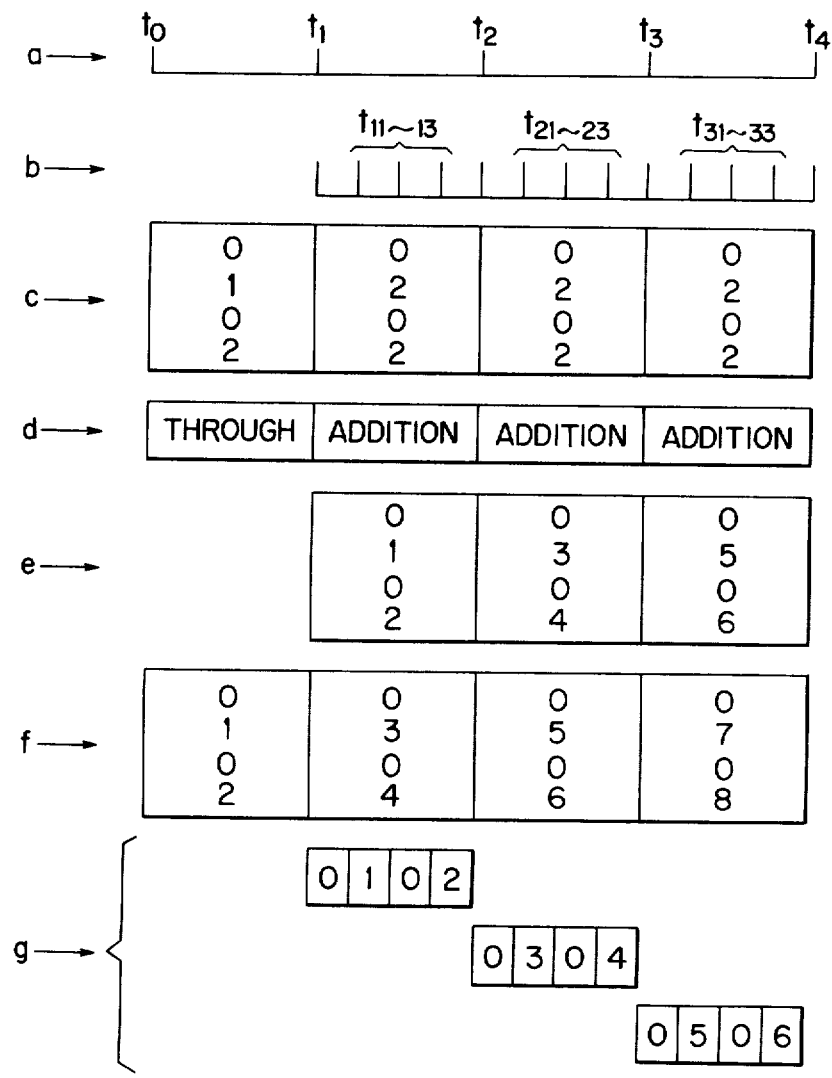

HIGH-SPEED PATTERN GENERATOR

BACKGROUND OF THE INVENTION

1. Field of the Invention:

The present invention relates to a high-speed pattern generator for testing LSIs (Large Scale Integrated circuits) at high speeds.

2. Prior Art:

With the operation speed of LSIs becoming higher and higher, pattern generators for testing the LSIs are required to produce an output of high frequencies. Conventional pattern generators, however, have generated an output which has a maximum repetition frequency of 20–30 MHz.

SUMMARY OF THE INVENTION

A plurality of n units each comprise a register and an ALU and effects parallel processing of data therein. The outputs from the units are applied to n-bit shift registers in which data are shifted by clock pulses which are n in number. The shift registers can thus produce pattern outputs at a rate that is n times faster than that of a conventional pattern generator.

It is an object of the present invention to provide a high-speed pattern generator which is capable of producing a pattern output having a high pattern repetition frequency.

The above and other objects, features and advantages of the present invention will become apparent from the following description when taken in conjunction with the accompanying drawings which show preferred embodiments of the invention by way of illustrative example.

BRIEF DESCRIPTION OF THE DRAWINGS

FIG. 4 is a table showing the relationship between clock pulses, input data, modes of operation of ALUs, status of registers, outputs of ALUs, and outputs of shift registers;

DETAILED DESCRIPTION

Figure 1:
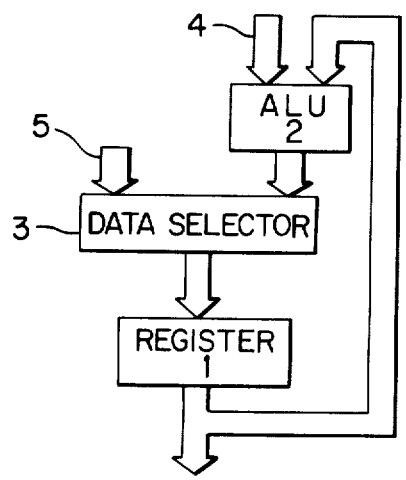
FIG. 1 is a functional diagram of a conventional pattern generator.

FIG. 1 shows in block form an address generator in a pattern generator which has been generally used. The address generator includes an address register 1, an arithmetic and logic unit (hereinafter referred to as "ALU") 2, and a data selector 3, there being input data 4, 5 supplied to the ALU 2 and the data selector 3, respectively. The ALU 2 is also supplied with the output from the register 1, and the data selector 3 is also supplied with the output from the ALU 2. The data selector 3 produces an output applied to the register 1, the output of which is utilized as a pattern output.

When the address of the pattern output is to be increased by increments of 1, the data 5 has an initial value of "0" and the data 4 will add "1", with the ALU 2 being set in the addition mode. The data selector 3 selects the data 5 in a first step, allowing the register 1 to hold "0". In a second step, the value "0" from the register 1 and the value "1" of the data 4 are added together by the ALU 2, which produces an output of "1". At this time, the data selector 3 is switched to select the output of the ALU 2, whereupon the register 1 holds "1". In a third step, the value "1" from the register 1 and the value "1" of the data 4 are added together by the ALU 2, which produces an output of "2", enabling the register 1 to hold "2". The foregoing operation is repeated to increase the output of the register 1 by increments of 1.

The rate or frequency of generation of patterns with the pattern generator as shown in FIG. 1 is determined by the sum of a delay time due to the data selector 3 and an operation time of the ALU 2, and has conventionally been a maximum of 20–30 MHz.

Figure 2:
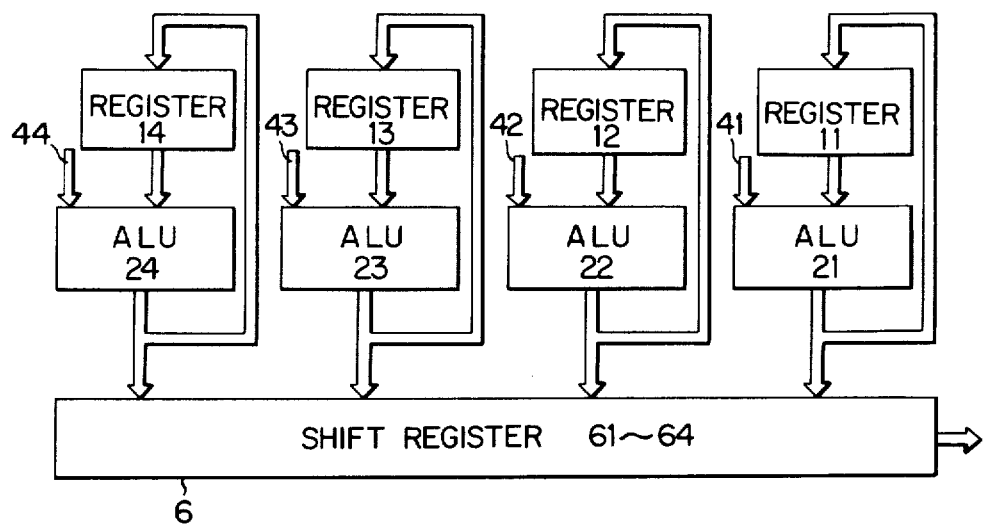
FIG. 2 is a functional diagram of a high-speed pattern generator according to the present invention.

FIG. 2 illustrates a high-speed pattern generator according to an embodiment of the present invention. The pattern generator comprises a plurality of units each including a register 11–14 and an ALU 21–24 to which data 41–44 are transmitted. The units are provided in n in number, n being a positive integer that satisfies the relation $n \geq 2$. In the illustrated embodiment, n is four. The ALUs 21–24 each produce an output of m bits in which m is a positive integer $\geq 1$. Designated at 6 is a group of n-bit shift registers which are m in number. The outputs of the ALUs 21–24 are applied to the respective shift registers 6 at their corresponding bits.

Figure 3:
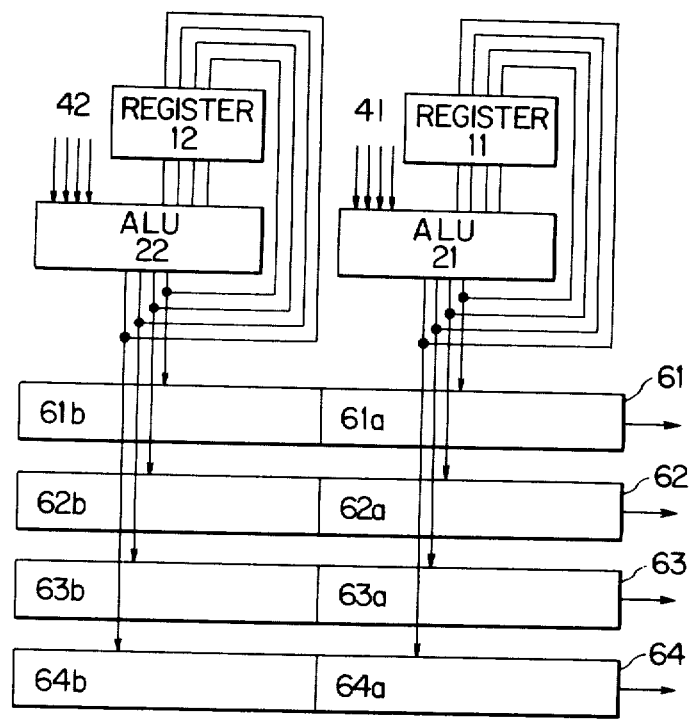
FIG. 3 is a detailed functional diagram of a portion of the high-speed pattern generator shown in FIG. 2.

FIG. 3 shows first and second units and coacting regions of the group 6 of shift registers. The first and second units are composed of the register 11 and the ALU 21, and the register 12 and the ALU 22, respectively. Each of the ALU 21, 22 produces outputs of 4 bits, and hence m=4 in the illustrated embodiment. The number of shift registers is therefore four, and they are identified by 61–64. The four outputs from the ALU 21 are transmitted respectively to first bits of the corresponding shift registers 61–64. More specifically, the first output from the ALU 21 is applied to the first bit 61a of the shift register 61, the second output from the ALU 21 to the first bit 62a of the shift register 62, and so on. Likewise, the ALU 22 generates four outputs that are applied to second bits, respectively, of the shift registers 61–64. In general, the ith unit out of n units produces m-bit outputs that are transmitted in the same sequence to the ith bits of m shift registers, where i should meet the requirement of $n \geq i \geq 1$.

Generation of intermittently incremental patterns with the arrangement as shown in FIGS. 2 and 3 will be described with reference to FIG. 4. By the term "intermittently incremental patterns" is meant pattern generation wherein the number is incremental every other patterns as in 0, 1, 0, 2, 0, 3, 0, 4 . . . .

Designated at a are clock pulses for the registers 11–14, the clock pulses being produced at intervals of $t_0$–$t_4$.

Designated at b are clock pulses for the shift registers 61–64, the clock pulses including those generated at intervals of $t_{11}$–$t_{13}$, $t_{21}$–$t_{23}$, $t_{31}$–$t_{33}$ in addition to $t_0$–$t_4$. With n=4 in the arrangement of FIG. 2, there are produced four clock pulses at b per one clock pulse at a.

The data 41–44 will have values as indicated at c in FIG. 4. Upon application of the clock pulse at $t_0$, the data 41, 42, 43 and 44 give values 0, 1, 0 and 2, respectively, which will remain the same until the next clock pulse is applied at $t_1$. With the clock pulse being applied at $t_1$, the data 41–44 will supply values of 0, 2, 0 and 2, respectively, which will remain unchanged even when the clock pulses are applied at $t_3$-$t_4$.

Modes of operation of the ALUs 21-24 are indicated at d in FIG. 4. The ALUs are in a through mode in the interval between $t_0$ and $t_1$, and in an addition mode in the intervals between $t_1$, $t_2$, $t_3$ and $t_4$. When the ALUs 21-24 are in the through mode, only the values of the data 41-44 appear as the outputs of the ALUs 21-24. When the ALUs 21-24 are in the addition mode, the outputs of the ALUs 21-24 are the respective sums of the values of the data 41-44 and the outputs from the ALUs 21-24.

Contents of the registers 11-14 are indicated at e in FIG. 4. Upon application of the clock pulses at $t_1$-$t_3$, the registers 11-14 store the outputs of the ALUs 21-24 which have been produced respectively prior to application of those clock pulses, and hold the outputs until a next clock pulse is generated.

Designated at f in FIG. 4 are outputs from the ALUs 21-24. In the interval between $t_0$-$t_1$, the ALUs are in the through mode to allow the data values indicated as 0, 1, 0, 2 at c to become the outputs of the ALUs. The ALUs are in the addition mode in the interval between $t_1$ and $t_2$, adding the data values 0, 2, 0, 2 to the register contents 0, 1, 0, 2, so that the ALUs produce outputs of 0, 3, 0, 4. Similarly, the ALUs produce outputs of 0, 5, 0, 6 by adding the data values 0, 2, 0, 2 and the register contents 0, 3, 0, 4 in the interval $t_2$-$t_3$, and produce outputs of 0, 7, 0, 8 by adding the data values 0, 2, 0, 2 and the register contents 0, 5, 0, 6 in the interval $t_3$-$t_4$.

The shift registers 61-64 produce composite outputs as shown at g in FIG. 4. The clock pulse at $t_1$ causes the outputs 0, 1, 0, 2 from the ALUs 21-24 to be loaded in parallel into the shift registers 61-64, the first bits of which generate an output of "0" which will be taken out as a pattern generator output. Upon application of clock pulses at $t_{11}$-$t_{13}$, the contained data in the shift registers 61-64 are successively shifted to enable the second to forth bits thereof to produce outputs 1, 0, 2 which serve as pattern outputs. Likewise, succeeding pattern outputs are produced in response to application of clock pulses at $t_2$-$t_{23}$, $t_3$-$t_{33}$.

With the foregoing arrangement, the shift registers 61-64 can produce pattern outputs at higher speeds than those which depend solely on the sum of the delay time due to operation of the registers 11-14 and the operation time of the ALUs 21-24. Parallel processing of data in a plurality of operations can therefore generates pattern outputs at a frequency of 200 MHz-300 MHz which approximates the processing rate by the shift registers.

Figure 5:
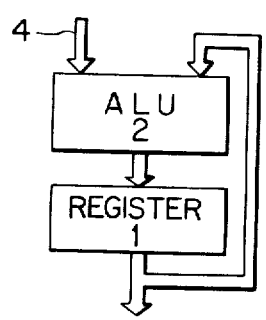
FIGS. 5 and 6 are functional diagrams of modified units.
Figure 6:
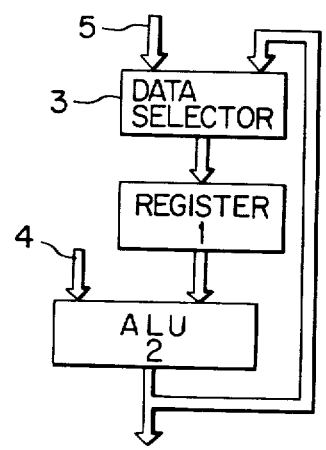

FIG. 5 illustrates a modified unit which differs from the unit shown in FIG. 2 in that the output of the unit is given by a register 1. The unit shown in FIG. 5 is connected to the shift registers 6 for effecting the same pattern generator shown in FIG. 2. In FIG. 6 another modified unit includes a register 1, an ALU 2, and a data selector 3. The data selector 3 generates an output which is applied to the register 1, the output of which is supplied to the ALU 2, the output of the ALU 2 being sent back to the data selector 3 and also applied to the shift registers 6. The ALU 2 and the data selector 3 are supplied with data 4 and 5, respectively.

Figure 7:
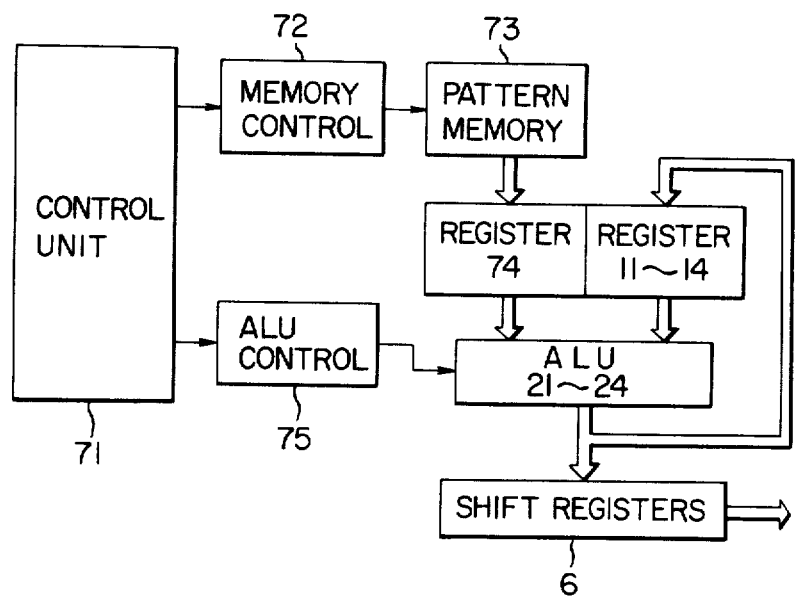
FIG. 7 is a functional diagram of an operation control for the pattern generator shown in FIG. 2.

FIG. 7 shows a control arrangement for operation of the pattern generator as illustrated in FIG. 2. A control unit 71 controls the overall system as shown and comprises a microprogram memory. A memory control 72 controls the address of a pattern memory 73 under the command of the control unit 71. The stored content of the pattern memory 73 is transmitted to a register 74, the output of which is applied to the ALUs 21-24. An ALU control 75 controls the modes of operation of the ALUs 21-24 under the command of the control unit 71.

Although certain preferred embodiments have been shown and described, it should be understood that many changes and modifications may be made therein without departing from the scope of the appended claims.

What is claimed is:

1. A high-speed pattern generator comprising a plurality of n ($n \geq 2$) of units, said units comprising a plurality of n arithmetic and logic units (hereinafter referred to as "ALUs") having outputs in m bits ($m \geq 1$) and a plurality of n registers having outputs and also having inputs for receiving the outputs from said ALUs, the outputs of one of (a) said plurality of ALUs and (b) said plurality of registers being the outputs of said units, said generator further comprising a plurality m of n-bit shift registers, said ALUs having inputs for receiving input data and receiving outputs from said registers, said shift registers having inputs connected for receiving the outputs of said units in a manner to supply the outputs of the ith ($n \geq i \geq 1$) unit to ith bit inputs of said shift registers in the same sequence, thereby enabling said shift registers to produce a pattern output.

2. A high-speed pattern generator according to claim 1, wherein the outputs from said ALUs serve as said outputs of said units.

3. A high-speed pattern generator according to claim 1, wherein the outputs from said registers serve as said outputs of said units.

4. A high-speed pattern generator according to claim 2, wherein said n units further include a plurality of n of data selectors interposed between the outputs of the n ALUs and the inputs of the n registers, said n data selectors having inputs for receiving input data.

5. A high-speed pattern generator according to claim 1, further comprising, for applying said data to said data inputs of said ALUs, a control arrangement having a furher register with an output applied to the data inputs of said ALUs, a pattern memory the stored content of which is applied to said further register, a control unit and a memory control for controlling the address of the pattern memory under the command of the control unit, and an ALU control for controlling the mode of operation of the ALUs under the command of the control unit.

* * * * *